United States Patent [19]
Jang

[11] Patent Number: 5,444,004
[45] Date of Patent: Aug. 22, 1995

[54] CMOS PROCESS COMPATIBLE SELF-ALIGNMENT LATERAL BIPOLAR JUNCTION TRANSISTOR

[75] Inventor: Wen-Yueh Jang, Hsin Chu, Taiwan

[73] Assignee: Winbond Electronics Corporation, Hsin Chu, Taiwan

[21] Appl. No.: 227,358

[22] Filed: Apr. 13, 1994

[51] Int. Cl.⁶ ........................................ H01L 21/331
[52] U.S. Cl. ........................................ 437/31; 437/32; 437/162; 437/917; 148/DIG. 10; 148/DIG. 96
[58] Field of Search ..................... 437/31, 32, 162, 34, 437/41, 44, 917; 148/DIG. 10, DIG. 11, DIG. 96

[56] References Cited

U.S. PATENT DOCUMENTS

| | | | |
|---|---|---|---|
| 4,839,305 | 6/1989 | Brighton | 437/162 |
| 4,868,135 | 9/1989 | Ogura et al. | 437/34 |
| 4,906,588 | 3/1990 | Harrington, III | 437/31 |
| 4,962,053 | 10/1990 | Spratt et al. | 437/34 |
| 5,006,476 | 4/1991 | De Jong et al. | 437/31 |
| 5,086,005 | 2/1992 | Hirakawa | 437/162 |
| 5,187,109 | 2/1993 | Cook et al. | 437/32 |
| 5,194,926 | 3/1993 | Hayden | 437/31 |
| 5,304,501 | 4/1994 | Tong | 437/31 |
| 5,320,972 | 6/1994 | Wylie | 437/31 |
| 5,362,657 | 11/1994 | Henderson et al. | 437/31 |

Primary Examiner—Brian E. Hearn
Assistant Examiner—Tuan Nguyen
Attorney, Agent, or Firm—Meltzer, Lippe, Goldstein et al.

[57] ABSTRACT

A self aligned lateral BJT is disclosed which has a lightly doped first region of a first conductivity type, e.g., P-type. A heavily doped polysilicon region, of a second conductivity type, e.g., N-type, is provided on a portion of a surface of the first region. A heavily doped second region of the second conductivity type, is disposed in the first region below the polysilicon region. An oxide region is provided on a portion of the first region surface adjacent to the polysilicon region. A third region of the first conductivity type is disposed in the first region adjacent to the second region and below the oxide region. A heavily doped fourth region of the second conductivity type is disposed in the first region adjacent to the third region. The fabrication of the lateral BJT includes the step of forming a polysilicon region on a portion of the first region. Then, the second region is formed by diffusing an impurity from the polysilicon region into the first region. The third region is then formed adjacent to the second region. A portion of a surface of the third region near the second region is covered with the oxide region. Thereafter, the fourth region is formed adjacent to the third region by implanting ions into an uncovered surface portion of the third region.

5 Claims, 4 Drawing Sheets

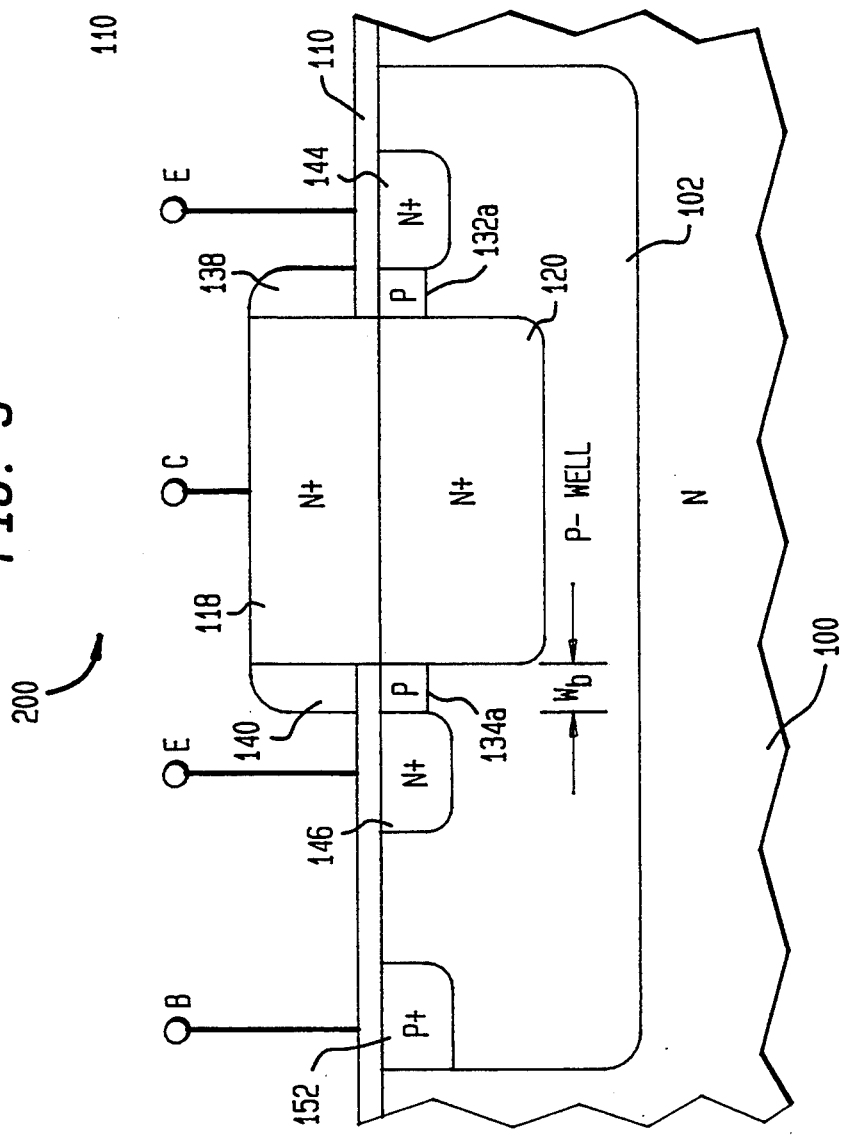

CMOS PROCESS COMPATIBLE SELF-ALIGNMENT LATERAL BIPOLAR JUNCTION TRANSISTOR

FIELD OF THE INVENTION

The present invention is directed to semiconductor devices. In particular, the invention is directed to a kind of semiconductor bipolar junction transistor (BJT) called a lateral bipolar junction transistor and a CMOS compatible process for making such a transistor.

BACKGROUND OF THE INVENTION

In the design of semiconductor integrated circuits (ICs) it is often desirable to provide a mixed mode device, i.e, which has both BJT and CMOS functions. Mixed mode devices both increase the flexibility of the IC design and increase the performance of the IC. When the performance of the BJT aspect of the mixed mode device is of concern, then a BiCMOS process is typically required. When the performance of the BJT aspect of the mixed mode device is not a priority, a parasitic BJT is formed in a CMOS structure. Generally speaking, the BiCMOS process is more complex and expensive than the CMOS process.

FIG. 1 shows a typical parasitic NPN vertical BJT 10. The vertical BJT 10 has a N+ emitter region 12. Two P+ base contact regions 16 and 18 are formed in a P-type base region 20. The base region 20, itself, is formed in P-well 20, above an N-type collector region 24. An N+ contact 26 is provided for the collector region 24 in the N-well 22, between two field oxide (fox) regions 28 and 30 (which may be $SiO_2$ regions).

The conventional vertical BJT 10 has two significant design limitations. First, the BJT 10 has a great base width $W_b$ which is equal to the depth of the P-well 22. Second, the vertical BJT architecture has a common collector structure. Such a structure provides for low current gain which is sometimes desirable. However, the vertical BJT 10 is restricted to common collector applications.

FIG. 2 shows a first conventional lateral BJT architecture 40. The NPN lateral BJT 40 has similarities to a CMOS device. That is, the lateral BJT 40 has a poly region 42 formed on a thin gate oxide layer 43. The thin gate oxide layer 43, itself, is formed on a P well 48 which is formed in an N-type substrate 50. An N+ emitter contact region 44 is provided adjacent to an N− emitter region 45 and an N+ collector contact region 46 is provided adjacent to an N− collector region 47. The emitter and collector regions 44/45, and 46/47 are very similar to drain and source regions. However, in this case, the bulk of the P well 48 functions as a base. In fact, a P+ base contact region 52 may be provided. The poly region 42 is typically grounded (as shown in phantom) or left floating.

The lateral BJT architecture 40 has two disadvantages. First, the lateral BJT 40 has a great base width $W_b$ which extends between the emitter 44/45 and collector 46/47 regions. This base width is limited by the width of the poly region 42 which in turn is limited by the photolithographic resolution of the fabrication process used to form the poly region 42. Second, the collector region 46/47 is only as deep as the emitter region 44/45. Thus, the collector 46/47 does not collect efficiently.

FIG. 3 shows a second lateral BJT architecture 60. The NPN lateral BJT 60 has a P well 62 formed in an N-type substrate 64. As before, an N+ emitter region 68 and an N+ collector region 70 are formed in the P well 62, wherein the bulk of the P well functions as the base. A P+ base contact 74 may also be provided. Unlike before, the emitter 68 and collector 70 regions are separated by a fox region 72 formed on the surface of the P well 62.

The lateral BJT architecture 60 also has a great base width $W_b$. In this case, $W_b$ is approximately equal to the size of the fox region 72, which size is limited by the photolithographic resolution of the fabrication process used to form the fox region 72. In addition, the fox region 72, which intrudes into the P well 62 affects the base width $W_b$. Thus, it is difficult to fabricate a lateral BJT 60 having particular desired characteristics with a high manufacturing tolerance.

It is therefore the object of the present invention to overcome the disadvantages of the prior art. It is also an object of the present invention to provide a mixed mode device which can be manufactured using CMOS compatible processes.

SUMMARY OF THE INVENTION

These and other objects are achieved by the present invention. According to one embodiment, a semiconductor device is provided which has a lightly doped first semiconductor region of a first conductivity type, e.g., P-type. A heavily doped poly region, of a second conductivity type, e.g., N-type, is provided on a portion of a surface of the first region. The semiconductor device also has a heavily doped second region of the second conductivity type, disposed in the first region below the poly region. An oxide region is provided on a portion of the first region surface adjacent to the poly region. A third region of the first conductivity type is disposed in the first region adjacent to the second region and below the oxide region. Furthermore, a heavily doped fourth region of the second conductivity type is disposed in the first region adjacent to the third region.

Illustratively, the semiconductor device is a self-alignment lateral BJT. In such a case, the poly region and second region illustratively form a collector of the BJT. The fourth region illustratively forms an emitter of the BJT and at least a portion of the first region forms a base of the BJT. In such a lateral BJT, the base width $W_b$ approximately equals the distance separating the fourth and second regions, i.e., the width of the third region.

According to another embodiment, the fabrication of the lateral BJT includes the following steps. The poly region is formed on a portion of the first region. Then, the second region is formed by diffusing an impurity from the poly region into the first region. The third region is then formed adjacent to the second region. A portion of a surface of the third region near the second region is covered with the oxide region. Thereafter, the fourth region is formed adjacent to the third region by implanting ions into an uncovered surface portion of the third region. The oxide region thus effectively shields a portion of the third region from ion implantation.

All of these steps are CMOS compatible fabrication steps. Furthermore, because the collector is formed by a different process than the emitter, the collector may be made deeper than the emitter thereby increasing the collecting efficiency of the collector.

In short, a self alignment lateral BJT is provided which can be made with CMOS compatible fabrication processes. The lateral BJT can easily be made with improved BJT characteristics, i.e., a narrow base width $W_b$ and improved collector efficiency, in a mixed mode semiconductor IC.

BRIEF DESCRIPTION OF THE DRAWING

FIG. 5 shows the self-alignment BJT according to one embodiment of the present invention.

DETAILED DESCRIPTION OF THE INVENTION

Figure 1:
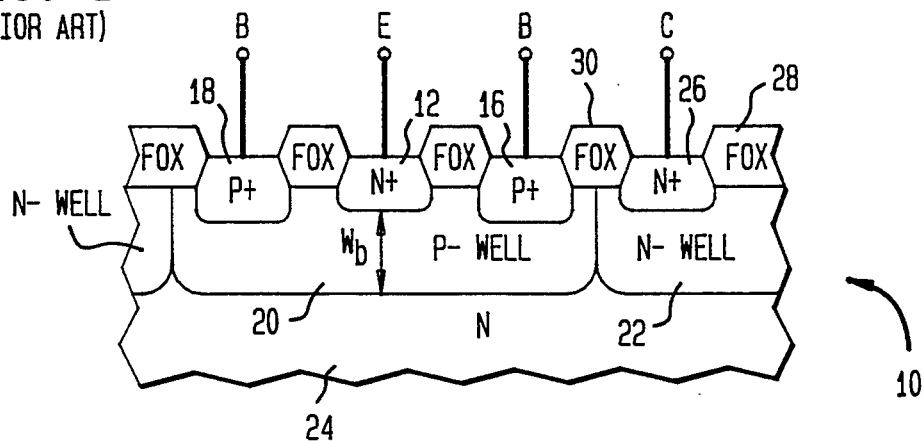
FIG. 1 shows a conventional parasitic vertical BJT.
Figure 2:
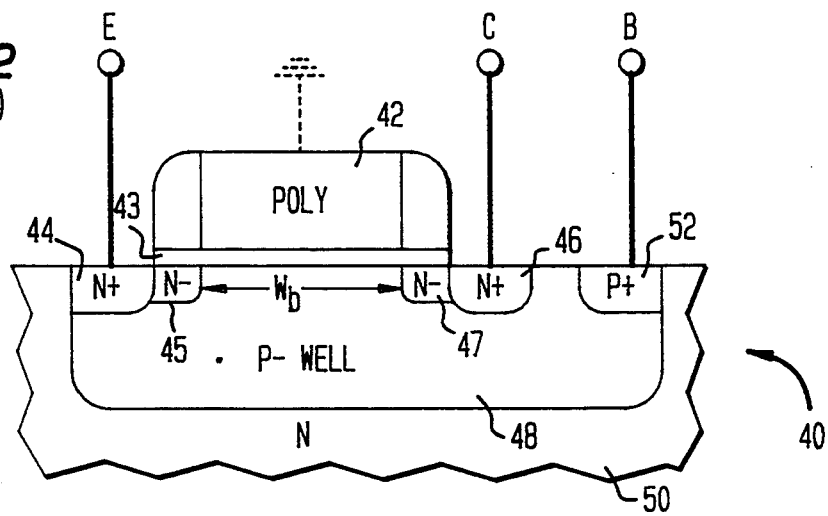
FIG. 2 shows a first conventional lateral BJT.
Figure 3:
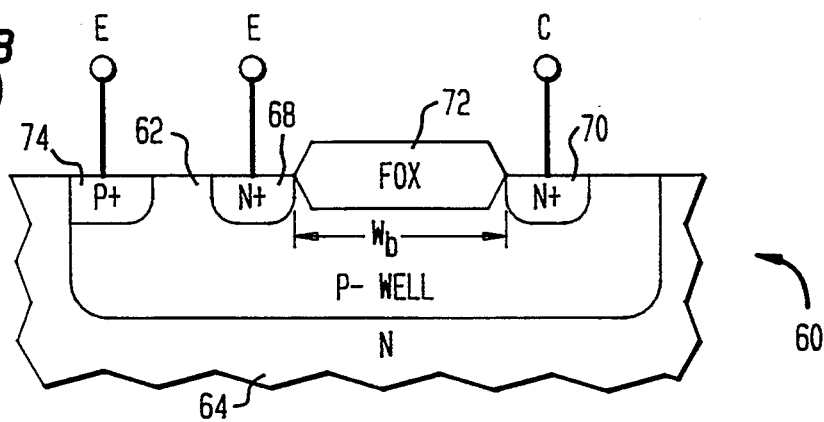
FIG. 3 shows a second conventional lateral BJT.

FIGS. 4A–G illustrate fabrication steps A–G according to one embodiment of the present invention. In step A, (FIG. 4A) a lightly doped well 102 of a first conductivity type, e.g., P-type, is formed in a substrate 104, e.g., an N-type substrate 104. This may be done either by implantation or diffusion. In step B, (FIG. 4B) fox regions 106 and 108 are formed on opposite boundaries of the well 102.

In step C (FIG. 4C) a thin gate oxide layer 110 is formed on the surface of the substrate 104 and well 102. A thin poly layer 112 is then formed on the gate oxide layer 110. Using a photolithographic technique, a photoresist layer 116 is then applied to the surface of the thin poly layer 112. Then, photoresist is removed from the window 114. The portions of the surface of the thin poly layer 112 not covered by the photoresist layer 116 are then etched. Thereafter, the thin gate oxide layer in the window 114 area is removed from the surface. The photoresist layer 116 is then removed.

In step D, (FIG. 4D) a poly layer 118 which is heavily doped with impurities of a second conductivity type, e.g., N-type, is formed on the surface of the thin poly layer 112 and well 102 surface area window 114 (exposed in step C). Typically, the poly layer 118 may be doped with a variety of N-type (such as phosphorus) or P-type (such as Boron) impurities. After the poly layer 118 is formed, the region 120 is formed using a thermal diffusion process. During the thermal diffusion process, impurities in the poly layer 118 diffuse through the window 114 into the well 102. An N+ region 120 is thereby formed. After forming the region 120, a photoresist region 122 is formed above a portion of the poly layer 118 in the vicinity of the window 114. The portions of the poly layer 118 not covered by the photoresist region 122 are then removed. As shown in step E, (FIG. 4E) an N+ poly region 124 is thereby formed.

In step E, (FIG. 4E) the photoresist region 122 is removed. Thereafter, another photoresist layer 126 is formed on the thin gate oxide layer 110. In forming this photoresist layer 126, windows 128 and 130 adjacent to the poly region 124 are not covered by the photoresist layer 126. Using an ion implantation technique, P-LDD (P-type lightly doped drain) regions 132 and 134 are formed in the portions of the well 102 surface corresponding to the windows 128 and 130. (The P-LDD regions 132 and 134 may be formed during a normal CMOS P-LDD implantation process.) $BF_2$ may be used in the implantation process. However, the photoresist layer 126 and poly region 118 prevent ions from being implanted into the well 102 and N+ region beneath the photoresist layer 126 and poly region 118, respectively. The photoresist layer 126 is then removed.

Figure 4A:
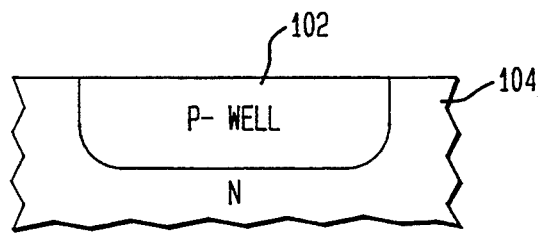
FIGS. 4A–4G show one embodiment of the inventive fabrication steps used to manufacture the self-alignment BJT of FIG. 5.
Figure 4B:
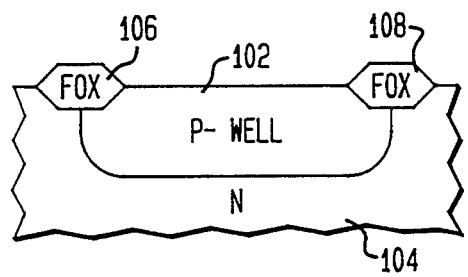
Figure 4C:
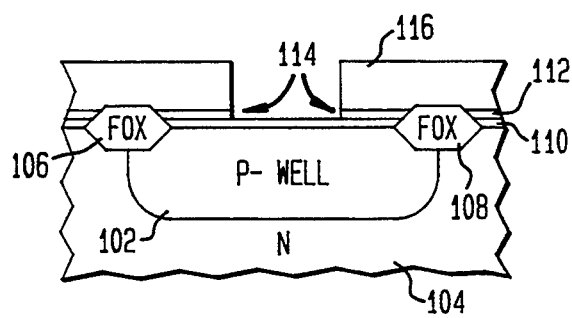
Figure 4D:
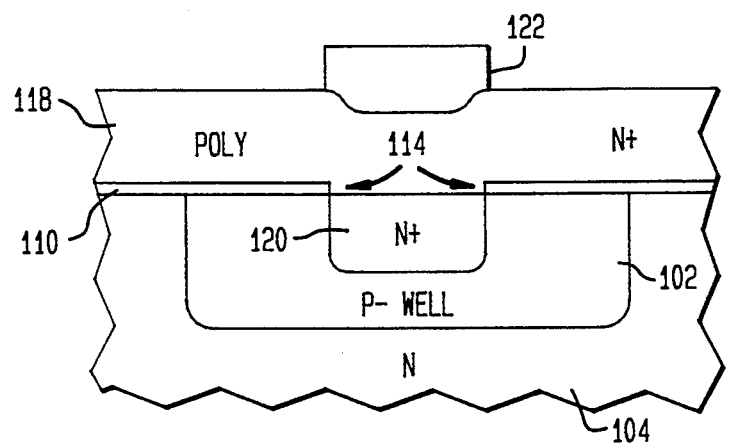
Figure 4E:
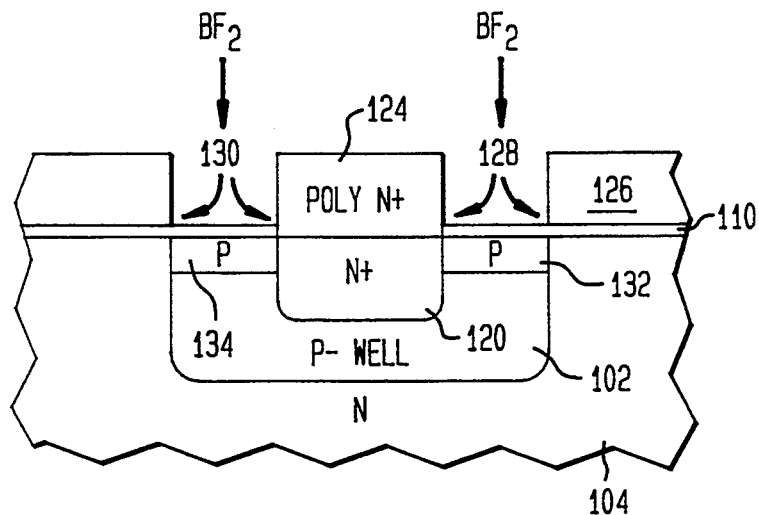
Figure 4F:
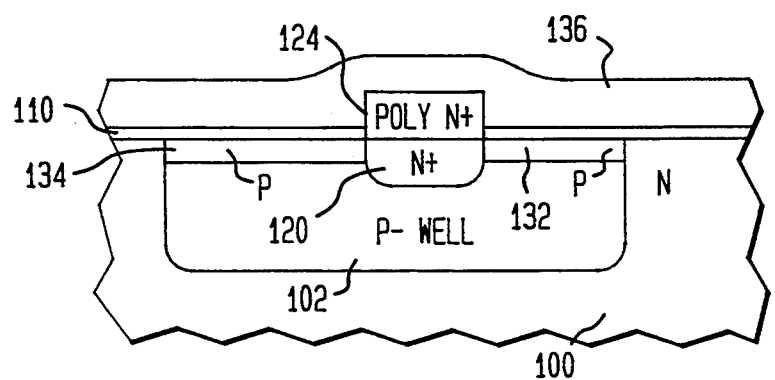
Figure 4G:
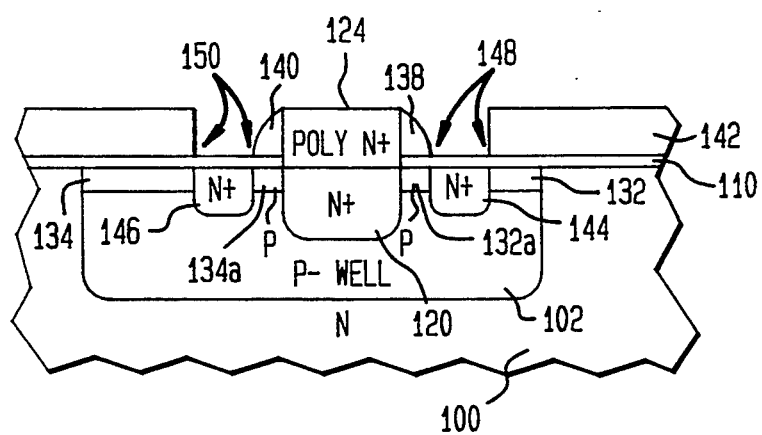

In step F, (FIG. 4F) an oxide layer 136 is formed on the surface of the thin oxide layer 110 and poly region 124. Next using an anisotropic etching technique, the oxide layer is etched to form oxide spacers 138 and 140 such as shown in step G (FIG. 4G). In step G (FIG. 4G), another photoresist layer 142 is formed on the surface of the thin oxide layer 110. As shown, windows 148 and 150 adjacent to oxide spacers 138 and 140 are not covered by photoresist layer 142. N+ regions 144 and 146 are formed using an ion implantation technique. (These regions 144 and 146 may be formed during a normal N+ source/drain implantation-formation process). Ions are implanted into the surface portions of the P-LDD regions 132 and 134 (and extend into the well 102). However, the oxide spacers 138 and 140 prevent ions from being implanted into portions 132a and 134a of the P-LDD regions 132 and 134 which lie approximately beneath the oxide spacers 138 and 140. The photoresist layer 142 may then be removed.

FIG. 5 shows a lateral BJT 200 according to one embodiment of the invention. As shown, the poly region 118 and N+ region 120 together function as a collector C. N+ regions 144 and 146 serve as an emitter E. The bulk of the well 102 functions as the base. A P+ base contact region 152 may also be provided.

Small P-LDD regions 132a and 134a function as spacers between the emitter regions 144 and 146 and the collector region 120. The width of the P-LDD regions 132a and 134a measured in the direction parallel to the distance separating the regions 144 and 146 from the collector region 120 is approximately equal to the base width $W_b$. It is thus advantageous to minimize the width of the regions 132a and 134a. The size of the P-LDD regions 132a and 134a are determined by the thickness of the oxide spacers 138 and 140 and the height of the poly region 124. However, the size of the oxide spacers 138 and 140 are not limited by the photolithographic resolution of the fabrication process. Rather, they can be made smaller by adjusting the thickness of the oxide spacers 138 and 140 or the height of the poly region 124. Thus, a relatively narrow base width $W_b$ with a high current gain can be provided.

As shown, the collector region 120 is made much deeper than the emitter regions 144 and 146. This is possible because the collector region 120 is formed separately from the emitter regions 144 and 146 using a thermal diffusion process. Thus, the efficiency of the collector 118/120 is increased.

Illustratively, the poly region 124 has a doping concentration of $10^{20}$ cm$^{-3}$ and a width of 0.5 μm. The well 102 may have a doping concentration of $8 \times 10^{16}$ cm$^{-3}$ and may have a depth of 1.8 μm. The collector region 120 illustratively has a doping concentration of $10^{18}$ cm$^{-3}$ and a depth of 0.6 μm. The spacer regions 132a and 134a may illustratively have a doping concentration of $6 \times 10^{17}$ cm$^{-3}$ a width of 0.1 μm and a depth of 0.25 μm. Likewise, the width of the oxide spacer regions may be 0.15 μm. The emitter regions 146 and 144 illustratively have a doping concentration of $10^{20}$ cm$^{-3}$ and a depth of 0.2 μm.

The above fabrication process and lateral BJT are illustrated for an NPN BJT. However, the discussion applies analogously for manufacturing a PNP BJT. In the PNP fabrication process, the photoresist layers 126 and 142 in the ion implantation steps E and G must be suitably modified for N-LDD formation.

In short, a self-aligned lateral BJT and process for its manufacture are disclosed. A poly region is formed on a first region of a first conductivity type and impurities are diffused therein to form a heavily doped second region of a second conductivity type. A third region of the first conductivity type is provided adjacent to the second region and beneath an oxide region disposed on the first region surface adjacent to the poly region. A heavily doped fourth region of the second conductivity type is formed adjacent to the third region. The poly and second region for a collector, the fourth region forms an emitter and at least a portion of the first region forms a base of the BJT. Because the fourth region is formed by implanting ions into the third region except for the portion thereof below the oxide spacer, the fourth region may be formed very close to the second region. Thus, the base width may be made very narrow. Furthermore, because the second region is formed in a different and separate step as the fourth region, it may be made deeper than the fourth region thereby increasing the collector efficiency of the BJT.

Finally, the above description is intended to be merely illustrative. Numerous alternative embodiments may be devised by those having ordinary skill in the art without departing from the spirit and scope of the following claims.

I claim:

1. A process for manufacturing a lateral bipolar transistor which is CMOS process compatible comprising the steps of:

forming a collector region by:

forming a heavily doped polysilicon region of a second conductivity type, on a portion of a lightly doped first region of a first conductivity type, and forming a heavily doped second collector region of said second conductivity type by thermally diffusing an impurity from said polysilicon region into said first region, and forming an emitter region and a base region by:

forming a third region of said first conductivity type adjacent to said second collector region, covering a portion of a surface of said third region with an oxide region, said covered portion of said third region delineating a width of said base region, and forming a heavily doped fourth emitter region of said second conductivity type adjacent to said base region by implanting ions into a surface portion of said third region other than said surface portion covered by said oxide region and adjacent to said covered base region.

2. The process of claim 1 wherein said step of covering comprises the steps of:

forming an oxide layer on a surface of said polysilicon region, a surface of said first region and said surface of said third region, and anisotropic etching said oxide layer.

3. The process of claim 1 wherein said step of forming said polysilicon region comprises:

forming a gate oxide layer on a surface of said first region, forming a polysilicon layer on said gate oxide layer, forming a photoresist layer on said polysilicon layer, forming a window in said photoresist layer which window exposes a portion of said poly silicon layer, and which window delineates a boundary of said polysilicon region, etching said portion of said polysilicon layer exposed by said window and removing a portion of said gate oxide layer underneath said etched portion of said polysilicon layer to expose a portion of said surface of said first region, and forming said polysilicon region on said exposed portion of said surface of said first region at said window.

4. The process of claim 1 wherein said step of forming said fourth emitter region and said base region further comprises the step of narrowing a base width of said base region so that said base width is approximately equal to a width of said covered portion of said third region.

5. The process of claim 1 wherein said base region is entirely laterally juxtapositioned between said second collector region and said fourth emitter region.

* * * * *